United States Patent [19]

Baltusis

[11] Patent Number: 5,644,235
[45] Date of Patent: Jul. 1, 1997

[54] USE OF AUDIO SIGNALS FOR MONITORING SAMPLE SPINNING SPEEDS IN NUCLEAR MAGNETIC SPECTROMETERS

[75] Inventor: Laima Baltusis, Cupertino, Calif.

[73] Assignee: Varian Associates, Inc., Palo Alto, Calif.

[21] Appl. No.: 475,112

[22] Filed: Jun. 7, 1995

[51] Int. Cl.$^6$ ................................................ G01V 3/00
[52] U.S. Cl. .......................................... 324/321; 324/322
[58] Field of Search ........................... 73/488, 489, 494; 324/321, 318, 322

[56] References Cited

U.S. PATENT DOCUMENTS

| | | | |
|---|---|---|---|
| 3,815,426 | 6/1974 | Rohner | 73/488 |
| 4,452,079 | 6/1984 | Tiller | 73/488 |
| 4,456,882 | 6/1984 | Doty | 324/321 |
| 4,511,841 | 4/1985 | Bartuska et al. | 324/321 |
| 4,739,270 | 4/1988 | Daugaard et al. | 324/321 |
| 5,115,671 | 5/1992 | Hicho | 73/488 |

OTHER PUBLICATIONS

J. W. Beams, "An Apparatus for Obtaining High Speeds of Rotation", *Rev. Sci. Instrum.*, 1, (Nov. 1930), pp. 667–671.
J. W. Beams, "High Rotational Speeds", *J. Appl. Phys.*, 8, (Dec. 1937), pp.795–806.
W. D. Garman, "A Study of the High–Speed Centrifuge", *Rev. Sci. Instrum.*, 4, (Aug. 1993), pp. 450–453.
E. R. Andrew et al., "Nuclear Magnetic Resonance Spectra From A Crystal Rotated at High Speed", *Nature, Lond.*, 182, (Dec. 1958), p.1659.
I. J. Lowe, "Free Induction Decays of Rotating Solids", *Phys. Rev Lett.*, 2, (Apr. 1959), pp. 285–287.
E.R. Andrew et al., "High–Speed Rotors for Nuclear Magnetic Resonance Studies on Solids", *J. Mag. Res.*, 1, (1969), pp. 27–34.

R. G. Pembleton et al., "NMR Probe For Combined Homonuclear Multiple Pulse Decoupling and Magic Angle Spinning", *Rev. Sci. Instrum.*, 48, (Oct. 1977), pp. 1286–1289.
S. J. Opella et al., "Quick Sample Change Probe For Magic–Angle–Spinning NMR in a Superconducting Magnet", *J. Mag. Res.*, 37, (1980), pp. 165–169.
K. W. Zilm et al., "A High–Speed Magic Angle Spinner", published in *J. Mag. Res.*, 30, (1978), pp. 563–570.
B. Schneider et al., "A Variable–Temperature Probe For the Measurement of $^1$H NMR Spectra With Magic–Angle Rotation", *J. Mag. Res.*, 37, (1980), pp. 41–47.
V. J. Bartuska et al.,"A Magic–Angle Spinning System For Bullet–Type Rotors in Electromagnets", *J. Mag. Res.*, 42, (1981), pp. 312–321.
F. D. Doty et al.,"Design of High Speed Cylindrical NMR Sample Spinners",*Rev. Sci. Instrum.*, 52 (12), (Dec. 1981), pp. 1868–1875.
R. Eckman et al.,"Deuterium NMR in Solids with a Cylindrical Magic Angle Sample Spinner",*J. Mag. Res.*, 41, (1980), pp. 440–446.
Thomas D. Maier et al.,"Microprocessor–Based Magic–Angle–Sample–Spinning Rate Controller" *J. Mag. Res.*, 91, (1991) pp. 165–169.
J. N. Lee et al.,"Cylindrical Spinner and Speed Controller for Magic Angle Spinning Nuclear Magnetic Resonance", *Rev. Sci. Instrum.*, 55, (Apr. 1984), pp. 516–520.
H.J. deGroot et al.,"Magic–Angle–Sample–Spinning NMR Difference Spectroscopy",*J. Mag. Res.*, 77, (1988), pp. 251–257.
A. Samoson et al.,entitled"Double Rotor for Solid–State NMR",*Rev. Sci. Instrum.*, 60, (Oct.1989), pp. 3239–3241.
S. J. Putterman, "Sonoluminescence: Sound Into Light", *Scientific American*, (Feb. 1995), pp. 46–51.
Varian brochure entitled, Spinning Speed Control in MAS Experiments, (1993).

*Primary Examiner*—Louis M. Arana
*Attorney, Agent, or Firm*—Edward H. Berkowitz

[57] ABSTRACT

The use of audio signals from rotating samples in an NMR probe in a polarizing magnetic field as part of a nuclear magnetic spectrometer is presented.

3 Claims, 7 Drawing Sheets

USE OF AUDIO SIGNALS FOR MONITORING SAMPLE SPINNING SPEEDS IN NUCLEAR MAGNETIC SPECTROMETERS

FIELD OF INVENTION

This invention relates generally to nuclear magnetic resonance (NMR) analytic instruments and, in particular, to measuring spinning speeds of rotating samples in NMR probes within such instruments by detecting and utilizing the audio information radiated by the rotating sample.

BACKGROUND OF THE INVENTION

Since its discovery in 1946, Nuclear Magnetic Resonance (NMR), has become a powerful analytical tool in studies of gaseous, liquid, and solid materials.

An NMR measurement is made by determining the energy difference between nuclear spin states. In order to accomplish this, a sample of the material in question is placed in a polarizing magnetic field and excited by applying a second, oscillating magnetic field in a direction perpendicular to the first steady state field. This is accomplished by applying oscillating energy radio frequency (rf) energy across a coil surrounding the sample. The second magnetic field is created by modulating the current in this coil to produce pulses of a defined form. This second field causes transitions between nuclear spin states whose energies are determined by the first field. The energy absorbed by the nuclei during such an excitation or emitted thereby after such an excitation provides information on the differences in energy between the spin states.

After the application of the radio frequency pulse or pulses, the nuclei of interest produce a radio frequency signal known as a free induction decay (FID), which is detectable with a receiver system, where the coil surrounding the sample is the primary detection element. Traditional Fourier Transform analysis of the free induction decay (FID) generates a frequency spectrum, which contains one or several resonance frequencies or lines. The positions and widths of these resonance frequencies or lines are determined by a number of influences, such dipolar interactions, chemical shift, scalar coupling, or quadrupolar interactions on the nuclei of interest over and above that of the primary polarizing magnetic field. In certain cases the positions or resonance shifts can be partially of completely obscured by scalar and/or dipolar interactions. The accuracy of NMR measurements additionally depends upon the physical form of the sample being studied. Highly accurate chemical shift determinations and separation of NMR lines are possible for liquid samples due to the random tumbling and rapid reorienation of sample molecules in solution. This rapid reorientation effectively causes the surroundings of the resonating nuclei to appear isotropic on the time scale of the NMR experiment. If polycrystalline, powdery, glassy solids, or the like, are studied, however, the observable lines are broadened due to different orientations of particles with respect to the polarizing magnetic field.

Various methods have been employed to reduce the amount of line broadening observed in an NMR spectrum for solid samples. The line broadening can be partially overcome by using magic angle spinning (MAS). According to this technique, the sample is rotated rapidly at an angle of 54.7 degrees with respect to the polarizing magnetic field, i.e., the magic angle. This spinning removes so-called first order line broadening caused by such factors as chemical shift anisotropy, secular dipolar interactions, and first order quadrupolar interactions.

For magic angle spinning experiments spinning rate of the sample should be high in proportion with the strength of the inter-nuclear interaction or spread of chemical shift values, and is typically achieved with spinning rates of order of 1000 to 15,000 hertz (cycles per second) or 60,000 to 900,000 revolutions per minute or 1 to 15 khz. Finally, the spin rate must be relatively stable over the duration of the experiment in order not to reintroduce line broadening in the resulting spectrum.

Devices for spinning samples at very high spinning speeds were first developed in the 1920's and 1930's for various applications including the demonstration of Bernoulli's law for science students. (J. W. Beams, *Rev. Sci. Instr.*, 1, 667 (1930); J. W. Beams, *J. Appl. Phys.*, 8, 795 (1937); E. Henriot and E. Huguenard, *Compt. Rend*, 180, 1389 (1925); W. D. Garman, *Rev. Sci. Instrum.*, 4, 450 (1933)). The use of these devices in NMR experiments was published first in the late 1950's (E. R. Andrew, A. Bradbury and R. G. Eades, *Nature, Lond.*, 182, 1659 (1958); I. J. Lowe, *Phys. Rev. Lett.*, 2, 285 (1959)).

Subsequentally there were a number of improvements to the basic spinner assembly to increase both sample spinning stability and/or sample spinning speed published both in the scientific literature (E. R. Andrew, L. F. Farnell, M. Firth, T. D. Gledhill and I. Roberts, *J. Mag. Res.*, 1, 27 (1969); R. G. Pembleton, L. M. Ryan and B. C. Gerstein, *Rev. Sci. Instrum.*, 48, 1286 (1977); S. I. Opella, M. H. Frey and J. A. DiVerdi, *J. Mag. Res.*, 37, 165 (1980); K. W. Zilm, D. W. Alderman, and D. M. Grant, *J. Mag. Res.*, 30, 563, (1978); B. Schneider, D. Doskocilova, J. Babka and Z. Ruzicka, *J. Mag. Res.*, 37, 41 (1980); V. I. Bartuska and G. E. Maciel, *J. Mag. Res.*, 42, 312 (1981); F. D. Doty and P. D. Ellis, *Rev. Sci. Instrum.*, 52, 1868 (1981); R. Eckman, M. Alla, and A. Pines, *J. Mag. Res.*, 41, 440 (1980), K. W. Zilm, D. W. Alderman, and D. M. Grant, *J. Mag. Res.*, 30, 563 (1978)) and in U.S. Pat. No. 4,511,841 to Bartuska et al., U.S. Pat. No. 4,456,882 to Doty, and U.S. Pat. No. 4,739,270 to Daugaard et al.

The accurate measurement of sample spinning speed is important for a number of reasons. First, unless the sample is being spun extremely quickly at the magic angle in proportion to the nuclear interactions that are being minimized, the NMR frequencies being observed will be modulated by the sample spinning and will appear as spinning sidebands in the NMR spectrum. These sidebands must be identfied as such so that they are not interpreted as legitimate NMR resonances. Second, while spinning sidebands can be used in identifying the sample spinning speed after a spectrum has been accumulated, it is desirable to know what the spinning speed is prior to start of the experiment particularly when the sample is spinning at the high extremes of a probe's spinning speed specifications.

Non-NMR methods used for measuring for sample spinning speed, which have been described in the literature, are optical and audio methods. A portion of the sample spinning speed is in the range of audio frequencies detectable by the human ear. Audio detection of sample spinning speed in a high speed spinning device has been reported by Beams (J. W. Beams, *Rev. Sci. Instr.*, 1, 667 (1930)) and later in conjunction of the use of these high speed spinning devices in the context of NMR experiments by Andrew et at. E. R. Andrew, L. F. Farnell, M. Firth, T. D. Gledhill and I. Roberts, *J. Mag. Res.*, 1, 27 (1969)). The methods described by Andrew et al. consisting of listening to the charateristic fundamental audio note emitted by the rotor and beating it against a note from a loudspeaker fed from an audio signal generator. The authors found that at rates of rotation below about 500 Hz, a high frequency audio note at N times the fundamental is heard where N is the number of flutes on the rotor. At higher rates of rotation the note passes beyond the audio range of the human ear and the fundamental note equal to the rate of rotation is then heard. The beat note between this fundamental and the tone from the loudspeaker provided a sensitive indication of the constancy of rotation. Above a spinning speed of 6000 hertz this method becomes ineffective due to the limitation of the human ear.

Audio detection and monitoring of sample spinning has been abandoned in favor of detection of sample spinning via optical methods. Methods are known for detecting reflected light from a sample container to determine the sample spinning speed. It is additionally known to use optical signals from the spinning samples with computer controlled spinning devices, which automatically regulate the sample spinning speed during an NMR experiment. (T. D. Maier and T.Huang, *J. Mag. Res.*, 91,165 (1991); J. N. Lee, D. W. Alderman, J. Y. Jin., K. W. Zilm, C. L. Mayne, R.J. Pugmire, and D. M. Grant, *Rev. Sci. Instrum.*, 55, 516 (1984); H. J. M. DeGroot, V. Copie, S. O. Smith, P. J. Allen, C.Winkel, J. Lugtenburg, J. Herzfeld and R. G. Griffin, *J. Mag. Res.*, 77, 251 (1988)), Varian data sheet: Spinning Speed Control in MAS Experiments.

There are many reasons for the predominence of optical detection of sample and the abdandonment of audio detection of sample spinning speed. Foremost, the ease of implementation of optical detection techniques has caused the use of audio signals generated by the spinning sample to be ignored. The analysis of the audio frequencies of a spinning rotor have been relegated, therefore, to the analysis of the ear of the NMR spectrometer operator. Additionally, the presence of a polarizing magnetic field in which an NMR probe is subjected to radio frequency irradiation precludes the use of most conventional audio signal transducers, because they contain magnetic or electromagnetic components. Recent successful uses of piezoelectric devices for the measurement of vibrational frequencies in the range of those commonly generated by spinning samples in solid state NMR applications have been published recently. One application has been the use of piezoelectric tranducer to record the spinning speeds of two rotors in a double rotating probe (A. Samosen and A. Pines, *Rev. Sci. Instrum.*, 60, 3239 (1989). A second application (S. I. Putterman, *Scientific American*, February, 1995, p.46.) demonstrated the use of a piezoelectric transducer in monitoring high frequency sounds emitted by collapsing air bubbles in sonoluminescence experiments. Piezoelectric audio transducers by their nature should be operational in a polarizing magnetic field. The piezoeletric transducer derives its action from the relations found in certain crystals or specially treated ceramic materials between a mechanical strain of the piezoelectric material and the potential differences existing on conductor plates sandwiching the material.

Even though most spectroscopy practitioners use optical detection methods for determining the spinning speed of samples spinning at the magic angle, the experienced practitioner additionally listens to the quality of sound produced by spinning sample to determine if the sample is spinning correctly.

The easiest samples to pack and spin in magic angle containers or rotors are powdered materials. When the technique of magic angle spinning of samples was being developed, powdered materials were studied exclusively because these materials were relatively easy materials to pack and spin in a rotor, particularly as the initial designs of the magic angle spinning probe were somewhat difficult to spin even sometimes even without a sample. As the magic angle probe design improved, the ease of spinning conventional powder samples led to the interest of studying samples which were of less conventional such as beads, gels and other forms. These nonconventional samples require much more care in packing so that they spin properly. A sample, which is not spinning properly can exhibit several behaviours. It can occasionally "touchdown", that is temporarily oscillate in some manner and after a period of time correct itself to a proper spinning state. Further, the sample can "crash", that is stop spinning completely or spin/gyrate/oscillate in non-recoverable fashion. Additionally, all samples including well behaved powders are suceptable to sample "touchdowns" or "crashes" if samples are spun at extremely high spinning speeds. The optical signal recorded during a "touchdown" or "crash" provides less information than the audio signal. Depending on the motion of the rotor during a "touchdown" or "crash", in some cases the numerical readout of the optical signal can be extremely oscilatory; in other cases the numerical reading of the spinning speed can appear quite stable although the numerical reading is of no relation to actual sample spinning speed. To the experienced practitioner it is quite clear from the audio signal produced by the spinning sample the the sample has had a "touchdown" or "crash". The novice user with more limited experience or a hearing impaired user may not be capable of diagnosing with only his/her ears an incorrecly spinning sample.

This invention pertains to use of audio signals in a useful and automated fashion in: (1) monitoring the spinning frequency of the sample during the NMR experiment, (2) adjusting the bearing air if a "touchdown" or "crash" of the rotor occurs, and (3) a shutdown of the sample spinning and termination of the NMR experiment if the above described actions are unsuccessful. This invention pertains to the use of audio transducers, which are compatable with their use in polarizing magnetic fields and to radio frequency irradation for sample in said magnetic fields.

This invention is a benefit to both experienced and novice users of magic angle spinning NMR probes, because it allows for the use of the spectrometer in an automated fashion.

This invention is of great importance to both the experienced user and the novice user by preventing damage to the magic angle spinning probe when the sample is both rotating and precessing due to a rotor "crash" by terminating the gas supply to the spinning sample.

BRIEF DESCRIPTION OF THE INVENTION

The present invention exploits the production of audio frequencies by spinning samples in magnetic fields to provide information about the frequency of the sample rotation during the NMR experiment, the quality of the spinning of the rotating sample, and utilizing a feedback mechanism for the correction for an ill-spinning sample, and finally initiating appropriate shut-down procedures of both the NMR experiment and the sample spinning if the sample spinning could not be corrected and matched to predefined spinning criteria.

DETAILED DESCIPTION OF THE PREFERRED EMBODIMENT

Figure 1:
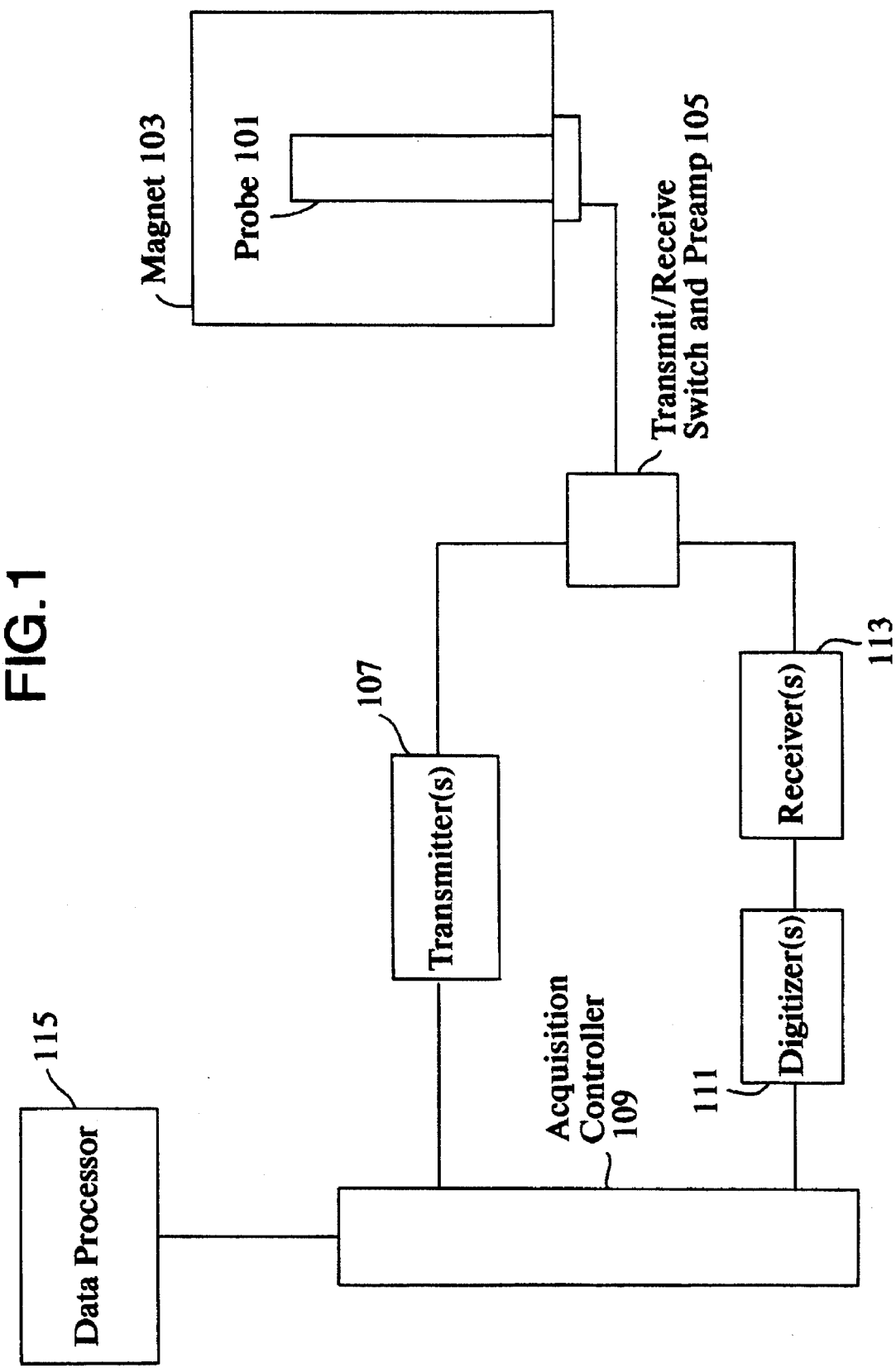
FIG. 1 is a schematic of NMR apparatus of the invention.

Portions of an NMR apparatus for practice of the invention are described schematically in FIG. 1. An NMR spectrometer comprises a polarizing magnet 103 providing an essentially homogeneous magnetic field into which a probe 101 is positioned. At least one radio frequency transmitter 107 and at least one receiver 113 and digitizers 111 are connected to the probe 101 via a transmit/receiver switch/preamplifier 105.

An acquisition controller 109 is connected to the radiofrequency transmitter(s) 107 in order to control the sequences of radio frequency pulses produced by the transmitter(s) 107 and applied to the probe 101. A data processor 115 is connected to an output of the aquisition controller 109. The data processor 115 is capable of storing, processing and displaying magnetic resonance signals detected by the receiver 113 and digitized by the digitizer 111. It is common practice in high resolution NMR studies to cause the sample to undergo a mechanical rotation about a selected axis. Thus the probe 101 will include a pneumatic apparatus for maintaining a gas bearing and a gas actuated rotor to which the sample is secured. Additionally, the speed of sample rotation is typically detected optically and displayed in a fashion useful to the practitioner.

Figure 2:
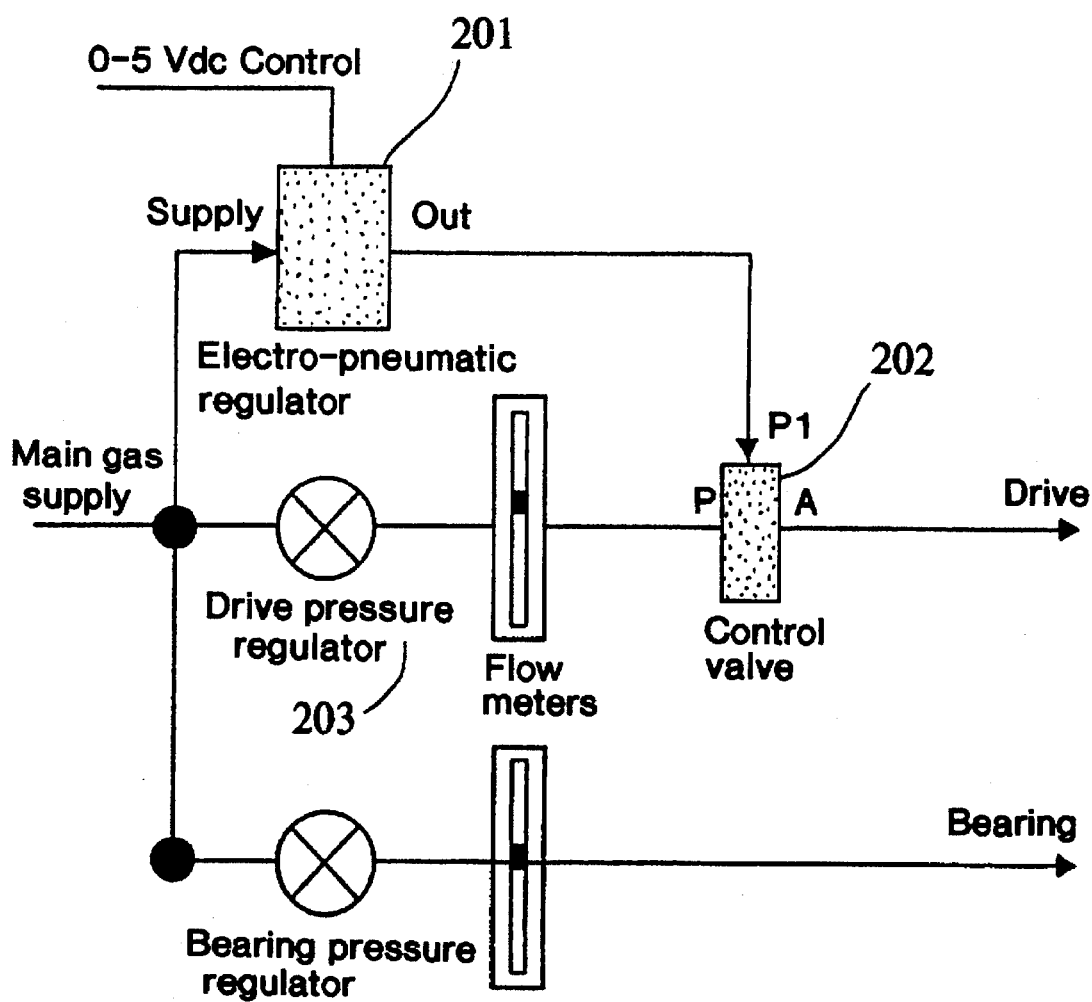
FIG. 2 shows a rotor controller pneumatics block diagram.

The amount of gas that is supplied to the probe is controlled as shown in FIG. 2, where a computer controlled electro-pneumatic regulator 201 and a control valve 202 are placed in series with the drive pressure regulator 203.

Figure 3:
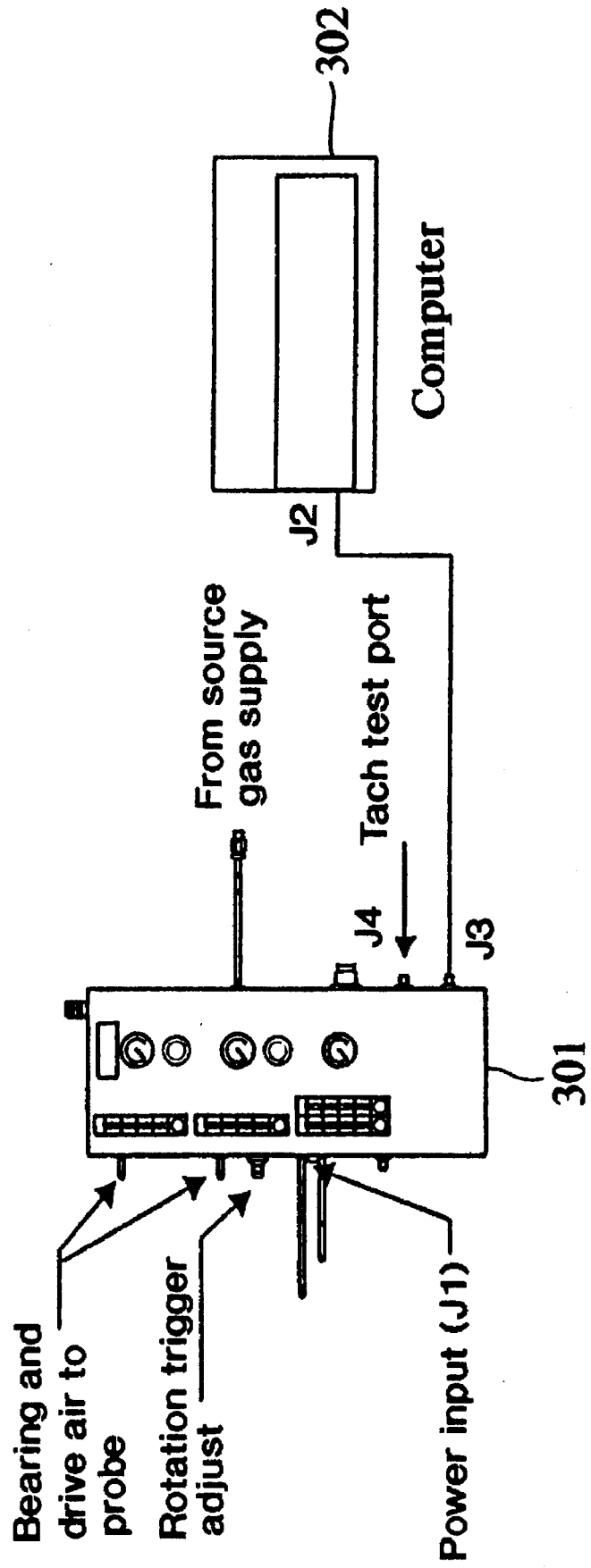
FIG. 3 shows a rotor controller connection diagram.

In a commonly used mode of operation for an NMR experiment the user specifies the desired spinning speed and a control algorithm regulates the gas flow through the electro-pneumatic regulator 201 and valve 202 as described in FIG. 2 to achieve the required spinning speed. FIG. 3 shows a connection diagam for controlling and regulating rotor speeds where the spinning speed is optically detected. The rotor speed is sensed by detecting the rotor pulses generated in the pneumatics and tachometer box 301 and the transmitting of the signal to a computer 302 where N rotor pulses are used to gate a counter operating at 1 MHz. In order to ensure an accurate measurement, the number of rotor periods N is optimized automatically in the control software. The desired spinning speed for the sample is entered into the computer 302.

The audio experiments were carried out on a representative rotor and stator as described below. The spinner unit is shown as disassembled constituents in FIGS. 4a–e. The rotor assembly comprises the end cap 10 and the rotor body 12. The rotor body 12 has a cavity 14 to contain the sample therein and is closed by insertion of the end cap 10. The length of the rotor body may include a portion 19 which may be arranged to cooperate in a known manner with a light source and light sensor, to monitor spinning rate during operation.

Figure 4A:
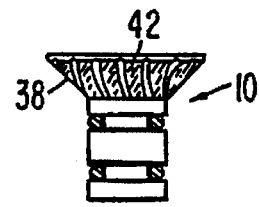
FIGS. 4a–4c shows a rotor assembly for the present invention
Figure 4B:
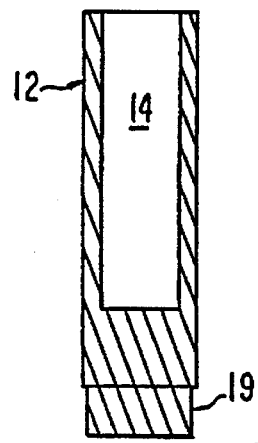
Figure 4C:
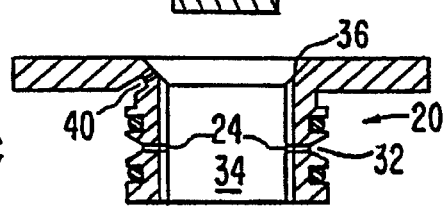
Figure 4D:
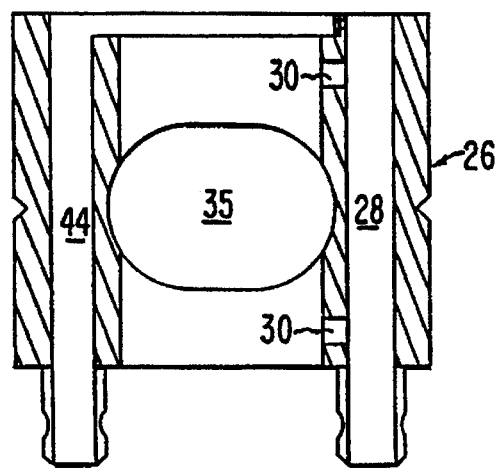
FIGS. 4d–4e shows a stator assembly for the present invention.
Figure 4E:
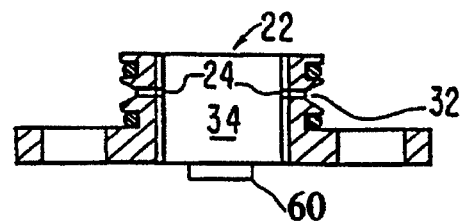

The stator assembly comprises three pieces as shown in FIGS. 4c–e. The top piece (top) 20 and bottom piece (bottom) 22 each contain twelve radially directed jets 24. These jets each comprise 0.3 mm aperatures. Stator body 26 contains a bore 28 with ports 30 to communicate with annular regions 32 to provide pressurized gas to radial jets 24 for stabilizing the axis of rotor body 12 in operation. When assembled, top and bottom 20 and 22 define bore 34 through which rotor body 12 is inserted for operation. An access port 35 is cut into the stator body 26 to permit insertion of the coil or coils employed for exitation and detection of nuclear magnetic resonance in the sample contained within the rotor body 12.

Top piece 20 has an inner conical surface 36 which accepts the outer conical profile 38 of end cap 10. Twelve jets 40 are distributed annularly on the inner conical surface 36 to provide pressurized gas, which acts on flutes 42 of the rotor assembly for levitating and rotating the rotor assembly. The pressurized gas for jets 40 is furnished form bore 44. These jets comprise aperatures of 0.4 mm diameter.

In typical operation, the gases in the respective bores 28 and 44 are maintained at different pressures. In a usual arrangement for such dual jet spinner apparatus, the rotation, or drive pressure may be several bars greater the the radial bearing pressure.

In the case that the sample in the rotor is packed properly the air pressure from both the drive and bearing air jets allows for the levitation and rotation of the sample. However, it is possible for the sample to be initally incorrectly packed in the rotor or during the course of the NMR experiment for the sample to become unbalanced. The result of either of these situations is a rotor "crash" or a severe impact of the rotor assembly against the stator. "Crashes" can cause damage to the stator and can entail the removal, disassembly, and replacement of portions of the the stator assembly.

For the described results, the audio transducer 60 was placed on the bottom portion of the bottom piece 22 of the stator. Without disassembly of the stator this was the closest that the audio transducer could be placed to the bearing jets. The audio transducer can be placed anywhere on the stator, but preferably as close to the bearing jets as possible in order to (1) reduce the interference of white noise of the gas flows as they flow into the stator and (2) in order to be able to detect higher signal-to-noise frequencies other than fundamental harmonics resulting from a rotor "touchdown" or "crash".

Figure 5:
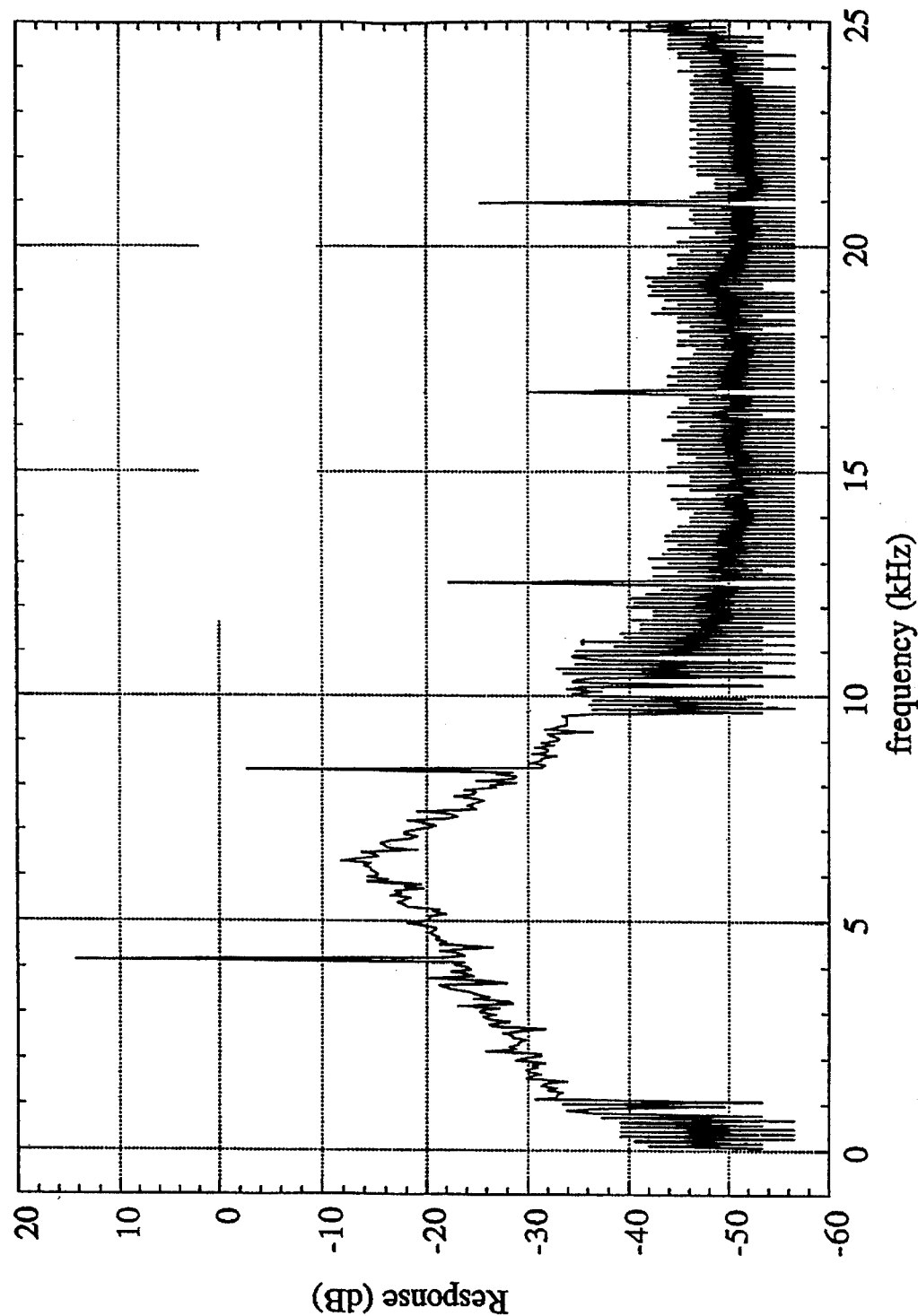
FIG. 5 shows a frequency spectrum of the audio signal when the sample is spinning smoothly.

FIG. 5 shows a representative trace of an audio signal which has been Fourier transformed resulting in a trace which plots frequeney on the abscissa (x-axis) and frequency intensity on the ordinate (y-axis) of the audio signal transmitted from the piezoelectric microphone attached to a stator as described in FIG. 4, through an audio amplifier circuit with an output suitable as input into a Hewlett-Packard spectrum analyzer, where the sample is spinning smoothly. The example shown is of the sample spinning smoothly with neither precession or oscillation of the sample as judged by (1) simultaneous speed detection via optical methods and (2) by an experienced user listening to the tone of spinning sample. The sample speed for this example was 4 kHz. This sample spinning speed is approximately midrange of the specified spinning speed for the probe in use. In addition to the fundamental frequency of the spinning rotor the second, third, fourth, and fifth harmonics were observed. As with most sound sources, the spinning sample does not vibrate in just one mode. Several modes of vibration have been set up simultaneously, generating a plurality of sound frequencies. The lowest frequency is the fundamental frequency. The higher frequencies are the harmonics. It is known that in the analysis of musical tones the relative intensities of the harmonics contribute in different ways to quality (harshness, brightness, etc.) of the sound produced. It has been observed that different samples spinning at the identical sample speed can vary in loudness and in quality of sound. A well packed powder sample will generally have the most quiet and pleasing to the human ear spinning sound. On the other hand, a sample of beads, for example, an irregularly shaped sample with voids within the sample will have the opposite quality of sound from that of the well packed powder. Potentially a spinning instability may be foreshadowed by observing changes in the relative intensities or positions of various harmonics.

Figure 6:
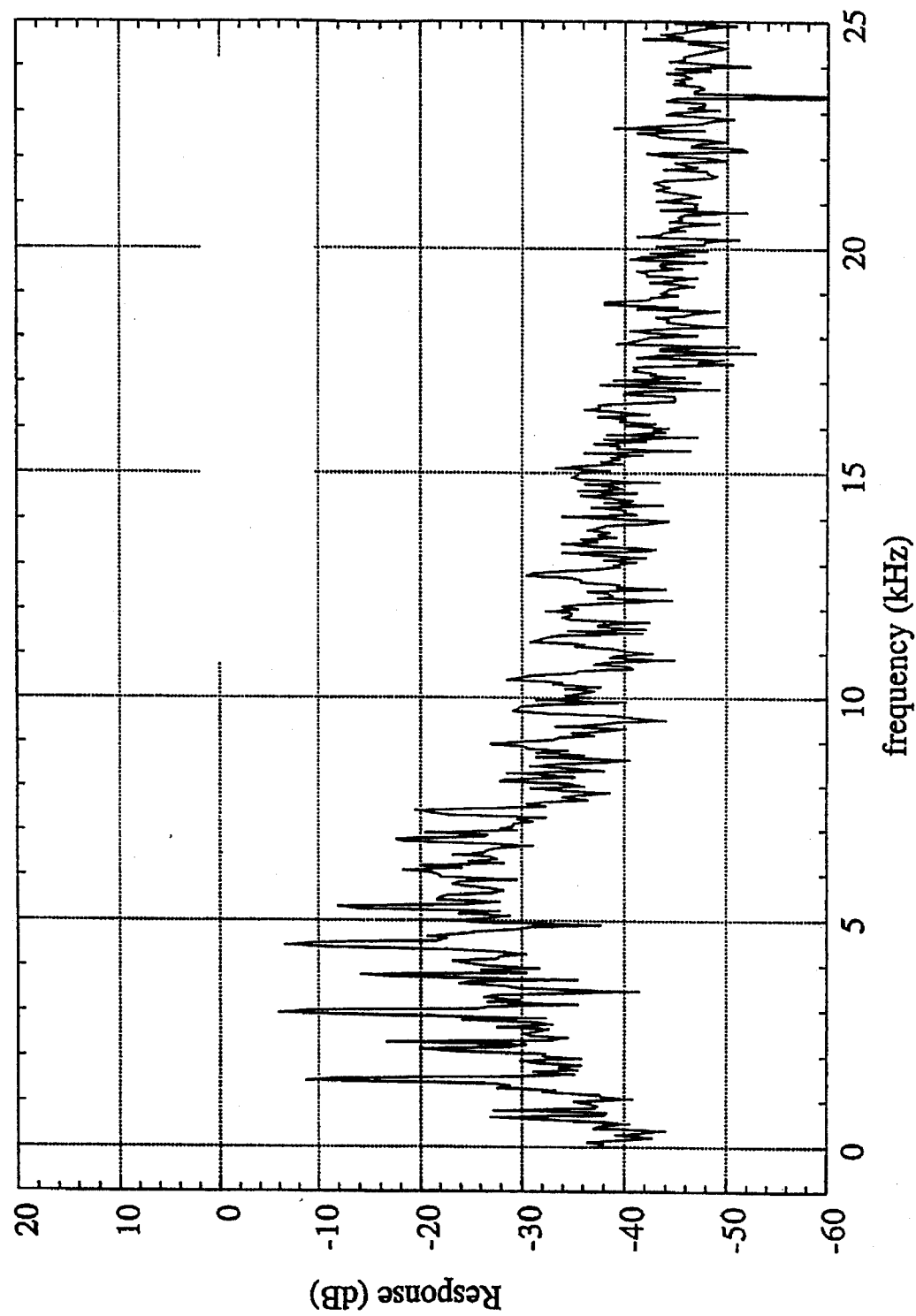
FIG. 6 shows a frequency spectrum of the audio signal when the sample has "crashed".

FIG. 6 shows a representative trace of an audio signal where the sample is not spinning correctly which has been Fourier transformed resulting in a trace which plots frequency on the abscissa (x-axis) and frequency intensity on the ordinate (y-axis) of the audio signal transmitted from the piezoelectric microphone attached to a stator as described in FIG. 4, through an audio amplifier circuit with an output suitable for input to a Hewlett-Packard spectrum analyzer. For the example shown, the sample spinning instability was induced by lowering the bearing pressure until the pressure was insufficient for sample levitation. The rotor is both spinning and precessing in the stator. The spinning instability was further demonstated by an observed oscillation in the bearing gas pressure as the rotor would touch down onto some of the bearing jets. Additionally and very important is that the optical signal recorded during a "crash" provides less information than the audio signal. Depending on the motion of the rotor during a "touchdown" or "crash" in some cases the numerical readout of the optical signal can be extremely oscillatory; in other cases the numerical reading of the optically derived spinning speed can appear quite stable although the numerical reading is of no relation to actual sample spinning speed.

The resulting frequency spectrum recorded in FIG. 6 during the "crash" is notable for its poorer signal-to-noise relative to the trace shown in FIG. 5. These data demonstrate the importance of placing audio detection devices as close to the bearing jets as possible. The main differences between the trace shown in FIG. 5 and that shown in FIG. 6 is that the previously seen fundamental frequencies and higher order harmonics have all disappeared and a set of lower frequencies have been recorded. For this particular situation the sample was restored to its stable spinning mode when the bearing pressure was increased. The frequency spectrum recorded after the bearing correction was identical to that shown in FIG. 5.

So far only the detection and recording of the audio signal of spinning samples have been demonstated. As with the optical signals from spinning samples which has been harnessed to provide both useful and regulatory information, so too can the audio signal be used to provide useful and regulatory information and as outlined in FIG. 7. In the present invention audio signals are used to regulate sample spinning via a computer controlled electro-pneumatic regulator and control valve placed in series with both the drive pressure regulator and the bearing regulator resulting in computer controlled drive gas 708 and computer controlled drive gas 709. The independent control of the bearing and drive pressure allows small corrections of the bearing pressure to occur in the case of the detection of small spinning instabilities by the audio detector 703. In the case of catastrophic "crashes", commands can be issued from a data processor 706 to first terminate the NMR experiment and to subsequentally termintate the sample spinning by first cutting off the gas supply to the drive gas 708 and then cutting off the gas supply to the bearing gas 709.

Figure 7:
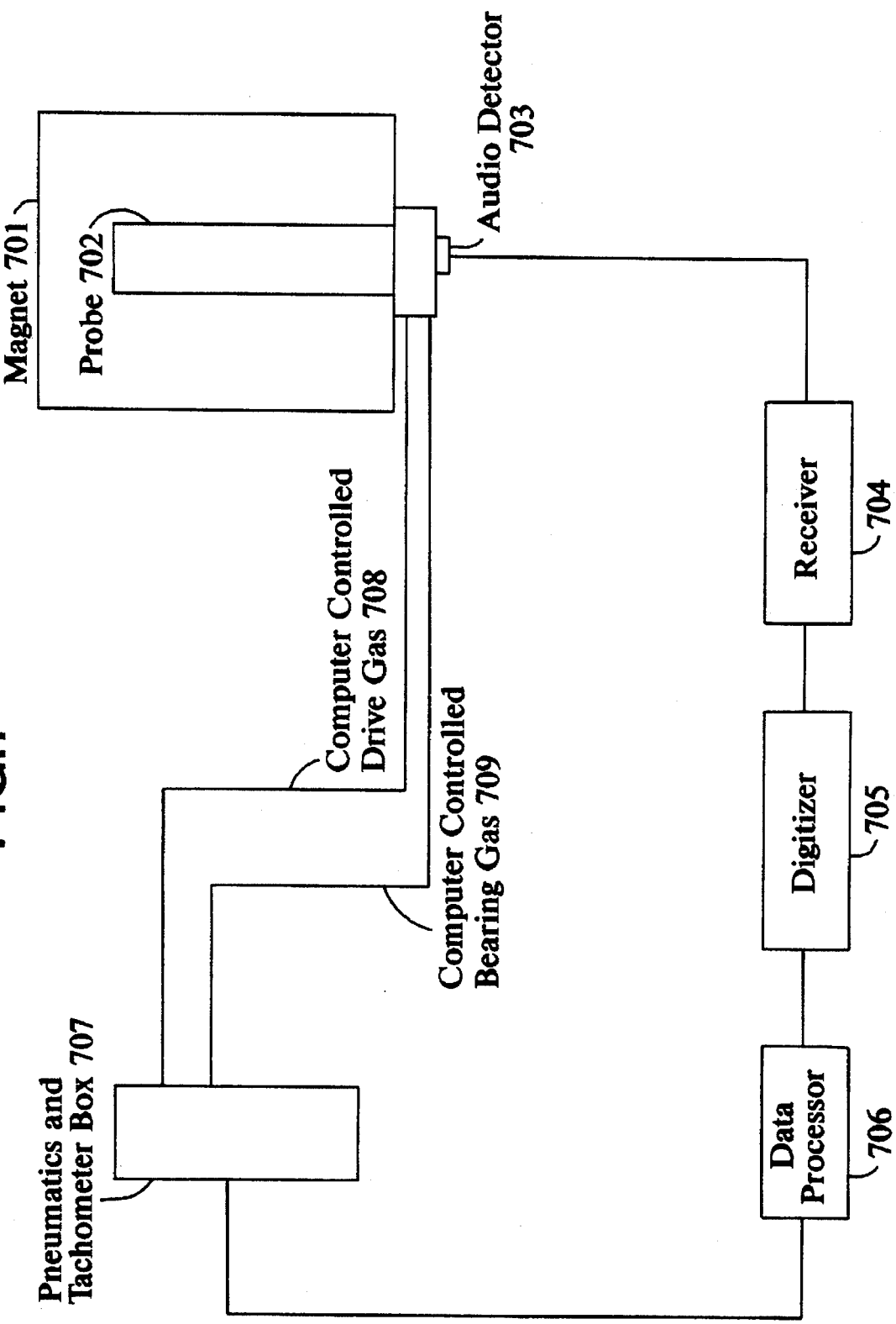
FIG. 7 is a schematic of a feedback circuit coupled to the audio detector measuring rotating sample spinning speeds.

However, the previously described set of regulatory actions cannot occur unless additionally, the audio signal, monitored by the audio transducer in the NMR probe and coupled to an appropriate audio amplifier, is detected and processed via a receiver 704 and digitizer 705. Processing of the audio signal by the data processor 706 connected to the receiver 704/digitizer 705 can then occur and the digitally processed stored signals can be used for interpretation and display by the data processor 706 as shown in FIG. 7. Interpretation of the processed audio signal may be accomplished in a number of ways, such as comparing peak intensities, or peak searching, or other processes well known to practitioners of the art form. If instabilities in rotor spinning or rotor "crashes" are detected, corrective action is specified by the data processor 706 to computer gas flows 708 and 709 to the spinning rotor. Potentially different ways to correct different spinning instabilities might be incorporated based on analysis of harmonic distributions, intensities and/or other spectral features. Several examples follow. (1) As the NMR experiment proceeds (which can be anywhere from minutes to hours) the sample spinning speed is monitored. Computer controlled pnuematics can change the bearing pressure to minimize the non-desired frequencies as predefined for the particular sample spinning criteria and demonstrated in FIG. 5 and FIG. 6. (2) Changes in the fundamental spinning frequency are additionally monitored and if there is a drop in spinning speed the drive gas speed is increased. (3) A detected drastic change in spinning speed can result in the orderly shutdown of both computer controlled bearing and drive pnuematics and also result in the termination of the NMR experiment. This process would eliminate any danger of probe damage and would also eliminate the further acquisition of large amplitude noise data when coupled with instructions to the NMR apparatus to cease data acquisition.

Many modifications and variations of the embodiments described herein will be apparent to those ordinarily skilled in the art. Such modifications and variations will still be within the scope of the invention. Therefore, the invention should not be limited by the scope of the embodiments described, but only by the claims which follow:

What is claimed is:

1. An apparatus for recording and analysis of a complete audio spectrum of a rotating sample in a nuclear magnetic resonance spectrometer comprising:

a. a polarizing magnet for imposing a DC magnetic field on said sample;

b. a nuclear magnetic resonance probe, comprising a rotor for containing a sample and rotation thereof responsive to pressurized gas directed along the outer surface thereof, and a stator surrounding said rotor, comprising bearing and drive gas jets to cause rotation of said rotor;

c. said nuclear magnetic resonance probe comprising an audio transducer proximate to said bearing and drive gas jets for acquiring the substantially entire frequency range of audio signals including the fundamental sample spinning frequency and higher and lower harmonics emitted by said sample during rotation;

d. an audio analyzer responsive to said substantially entire range of audio signals including the fundamental spinning frequency and higher and lower harmonics emitted by said sample during rotation;

e. a processor connected to said audio analyzer for accumulating, storing, and analyzing the entire audio spectrum emitted by said sample during rotation.

2. A method for analysis of spinning quality of an air bearing supported rotating sample in a nuclear magnetic resonance spectrometer, comprising:

a. detecting substantially the entire audio frequency range of audio signals from said rotating sample via an audio transducer proximate to said air bearing, b. processing said range of audio signals to obtain said substantially entire audio spectrum including the fundamental spinning frequency and higher and lower harmonics emitted by said sample during rotation;

c. accumulating, storing, and analyzing the substantially entire audio spectrum emitted by said sample during rotation by processor connected to said audio analyzer.

3. The method as described in claim 2, wherein the audio spectrum is evaluated relative to reference audio spectral data.

* * * * *